United States Patent
Heyne

(10) Patent No.: US 6,194,928 B1
(45) Date of Patent: Feb. 27, 2001

(54) INTEGRATED CIRCUIT WITH ADJUSTABLE DELAY UNIT

(75) Inventor: Patrick Heyne, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/408,687

(22) Filed: Sep. 30, 1999

(30) Foreign Application Priority Data

Sep. 30, 1998 (DE) .............................. 198 45 115

(51) Int. Cl.[7] ............................................. H03L 7/00
(52) U.S. Cl. ......................... 327/152; 327/147; 327/284
(58) Field of Search ............................. 327/2, 3, 5, 144, 327/146, 147, 149, 152, 155, 156, 158, 161, 269, 270, 271, 272, 276, 277, 278, 284, 293, 294

(56) References Cited

U.S. PATENT DOCUMENTS

| 5,376,849 | 12/1994 | Dickol et al. | 327/278 |
|---|---|---|---|
| 5,552,726 | * 9/1996 | Wichman et al. | 327/149 |
| 5,604,775 | 2/1997 | Saitoh et al. | 375/376 |
| 5,670,904 | 9/1997 | Moloney et al. | 327/277 |
| 6,069,506 | * 5/2000 | Miller, Jr. et al. | 327/156 |
| 6,072,347 | * 6/2000 | Sim | 327/276 |
| 6,100,735 | * 8/2000 | Lu | 327/158 |

FOREIGN PATENT DOCUMENTS

| 4110340C2 | 11/1993 | (DE) . |
|---|---|---|
| 69312465T2 | 7/1997 | (DE) . |
| 0208049A2 | 1/1987 | (EP) . |

* cited by examiner

*Primary Examiner*—Jeffrey Zweizig
(74) *Attorney, Agent, or Firm*—Herbert L. Lerner; Laurence A. Greenberg; Werner H. Stemer

(57) ABSTRACT

The delay unit has first delay elements each having a first delay time and second delay elements each having a second delay time. The second delay time is greater than the first delay time. A control unit controls the delay time of the delay unit by, first, incrementally increasing or by incrementally reducing the number of second delay elements in the signal path and thereby altering the actual value of the delay in the direction towards a desired (setpoint) value until the desired value is exceeded. The control unit then, by incrementally reducing or increasing, respectively, the number of first delay elements in the signal path, alters the actual value of the delay in the direction towards the desired value until the desired value is exceeded once more. In the event of subsequent changes in the desired value or in the actual value, the number of first delay elements is incrementally altered, while the number of second delay elements in the signal path is kept constant.

4 Claims, 2 Drawing Sheets

INTEGRATED CIRCUIT WITH ADJUSTABLE DELAY UNIT

BACKGROUND OF THE INVENTION

Field of the Invention

The invention lies in the integrated technology field. More specifically, the invention relates to an integrated circuit with an adjustable delay unit.

A delay unit with adjustable delay time is described in U.S. Pat. No. 5,670,904 to Moloney et al. Delay blocks are connected in a cascade circuit between an input and an output of the delay unit, a respective bypass element being assigned to the delay blocks. A signal path between the input and the output runs optionally via delay elements of the delay blocks or via the corresponding bypass element, depending on how the delay unit is driven. Accordingly, the relevant delay block does or does not contribute to the delay of the input signal. The delay elements within the delay blocks are realized by flip-flops. The individual delay blocks have a different number of delay units.

SUMMARY OF THE INVENTION

It is accordingly an object of the invention to provide an integrated circuit having a delay unit, which overcomes the above-mentioned disadvantages of the heretofore-known devices and methods of this general type and which have an adjustable delay time and in which the delay time is adjusted in a simple manner.

With the foregoing and other objects in view there is provided, in accordance with the invention, an integrated circuit, comprising:

- a delay unit having an input for receiving an input signal, an output for outputting an output signal delayed with respect to the input signal, and defining a signal path between the input and the output;
- the delay unit having first delay elements each having a first delay time and second delay elements each having a second delay time greater than the first delay time;
- a control unit connected to the delay unit for adjusting a delay of the delay unit, the control unit adjusting the delay of the delay unit by establishing a number of the first and the second delay elements in series in the signal path between the input and the output of the delay unit;
- the control unit, first, incrementally increasing or reducing a number of the second delay elements in the signal path, and thereby altering an actual value of the delay in a direction towards a setpoint value of the delay until the setpoint value is exceeded;
- the control unit, subsequently, incrementally reducing or increasing, respectively, a number of the first delay elements in the signal path, and thereby altering the actual value of the delay in a direction towards the setpoint value until the setpoint value once more crossed;
- the control unit, in response to subsequent changes in one of the setpoint value and the actual value of the delay, incrementally altering the number of the first delay elements in the signal path, while keeping the number of the second delay elements in the signal path constant; and
- wherein a sum of the first delay times of all of the first delay elements is at least three times greater than the second delay time.

In other words, the integrated circuit of the invention has a control circuit for adjusting the delay of the delay unit. The delay unit has an input for feeding in an input signal and an output for outputting an output signal which is delayed with respect to the input signal. For the purpose of adjusting the delay, the control unit establishes how many of the first and second delay elements are arranged (i.e. are active) in a series circuit in a signal path between the input and the output of the delay unit. The control unit, first of all by incrementally increasing or by incrementally reducing the number of second delay elements in the signal path, alters the actual value of the delay in the direction of a desired value until the desired value is exceeded. Subsequently, by incrementally reducing or by incrementally increasing, respectively, the number of first delay elements in the signal path, the control unit alters the actual value of the delay in the direction of the desired value until the desired value is exceeded again. In this case, in the event of subsequent changes in the desired value or in the actual value of the delay, the control unit incrementally alters the number of first delay elements in the signal path, while it keeps the number of second delay elements in the signal path constant. In this connection, "incrementally" means that in each case only one of the delay elements is successively added to the series circuit within the signal path or removed from the series circuit.

The invention may be referred to as coarse/fine adjustment of the delay time in the integrated circuit. The number of second delay elements is established in the series circuit of the signal path at the beginning of the operation. This enables the actual value of the delay to be approximated to the desired value in coarse steps. As soon as the desired value has been exceeded in the positive or negative direction, fine adjustment of the delay time is effected by the respective addition or removal of first delay elements in the signal path. When the actual value has been adjusted to the desired value as well as possible, adaptation to changes in the actual or desired value is effected only by changing the number of first delay elements within the signal path. Therefore, the invention is particularly suitable for applications in which, after initialization, the delay time is to be adjusted to an unknown desired value which can assume very different values, and in which, after initial adjustment of the actual value to the desired value, only slight fluctuations in the actual value or desired value occur. Fluctuations in the actual value are often caused by temperature changes, for example, in the case of delay elements.

In accordance with the invention, the sum of the first delay times of all the first delay elements is at least three times as large as the second delay time. This means that when the number of second delay elements in the signal path is kept constant the actual delay time of the delay unit, even in the event of fluctuations in the actual or desired value by more than the second delay time, can still be adjusted by way of the first delay elements.

In accordance with an added feature of the invention, at a start of the delay adjustment, the number of the first delay elements in the signal path is chosen such that the sum of the first delay times thereof is at least equal to the second delay time and is at most equal to the sum of the first delay times of all the first delay elements minus the second delay time. This means that accurate adjustment of the actual value to the desired value is always possible since in the event of the desired value being exceed during the alteration of the number of second delay elements, for the purpose of fine adjustment of the actual value, it is always possible respectively to remove from or add to the signal path so many first delay elements that the entire delay range between multiples of the second delay time is covered.

In accordance with an additional feature of the invention, at the start of the delay adjustment, none of the second delay elements are connected in the signal path.

In accordance with an alternative feature of the invention, all of the second delay elements are connected in the signal path at the start of the delay adjustment.

If, at the beginning of the adjustment of the delay, either none or all of the second delay elements is or are arranged in the signal path, the integrated circuit can be used to establish any desired delay time between zero and the sum of the first and second delay times of all the first and second delay elements.

Other features which are considered as characteristic for the invention are set forth in the appended claims.

Although the invention is illustrated and described herein as embodied in an integrated circuit having an adjustable delay unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
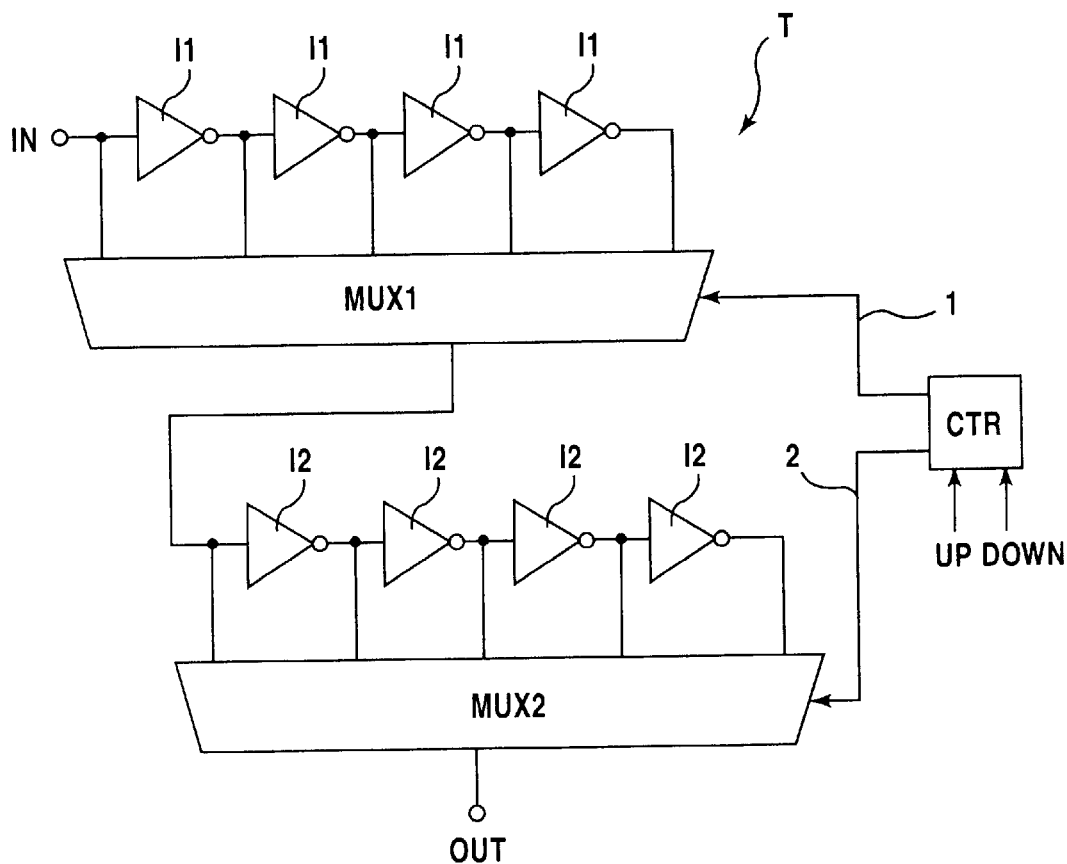
FIG. 1 is a diagrammatic view of an exemplary embodiment of the integrated circuit.

Referring now to the figures of the drawing in detail and first, particularly, to FIG. 1 thereof, there is seen a delay unit T having an input IN and an output OUT. A first multiplexer MUX1 with first delay elements I1 and a second multiplexer MUX2 with second delay elements I2 are connected between the input IN and the output OUT. The delay elements I1 and I2 are inverters. In other exemplary embodiments of the invention, however, it is also possible to use any other delay elements each having a defined delay time. The first delay elements I1 each have the same first delay time $t_1$. The second delay elements I2 each have a second delay time $t_2$. Only four first and four second delay elements I1, I2 are illustrated in FIG. 1. In reality, the delay unit T has substantially more first and second delay elements.

The delay elements I1, I2 are arranged in each case in a series circuit, the inputs and outputs of each delay element I1, I2 being connected to inputs of the associated multiplexer MUX1, MUX2. While the input IN of the delay unit is connected to the input of the series circuit of the first delay elements I1, the output OUT of the delay unit T is connected to the output of the second multiplexer MUX2. The output of the first multiplexer MUX1 is connected to the input of the series circuit of the second delay elements I2.

FIG. 1 also shows a control unit CTR of the integrated circuit, which is connected to a control input of the first multiplexer MUX1 via a first control line 1 and to a control input of the second multiplexer MUX2 via a second control line 2. The control unit CTR receives control signals UP, DOWN, as a function of which it performs driving of the multiplexers MUX1, MUX2. Depending on the driving by the control unit CTR, each multiplexer MUX1, MUX2 connects its output to one of its inputs. Depending on the setting of the multiplexers, a signal path is thus produced between the input IN and the output OUT of the delay unit T in which a specific number of first delay elements I1 and second delay elements I2 are arranged. The second delay time $t_2$ of the second delay elements I2 is substantially greater than the first delay time $t_1$ of the first delay elements I1. For example, the delay time of a CMOS inverter can be established by the width-to-length ratio of its transistors. If the main current path has a large length, the delay time is relatively long. If it has a large width, the delay time is relatively short.

Figure 2:
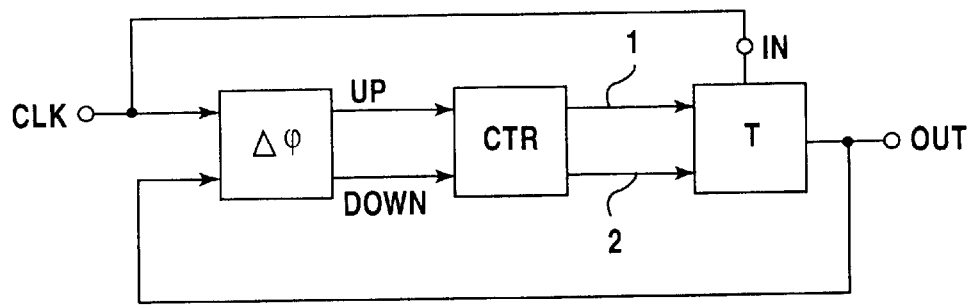
FIG. 2 is a diagrammatic view of further components of the integrated circuit of FIG. 1.

FIG. 2 shows that the components illustrated in FIG. 1 are arranged within a control loop of a delay locked loop (DLL). At the output OUT of the delay unit T, the DLL generates a delayed output clock signal from an input clock signal CLK. The output clock signal is in phase with the input clock signal CLK. The input clock signal CLK and the output clock signal are fed to a phase detector $\Delta\phi$ for the purpose of ascertaining the phase difference. If the phase detector $\Delta\phi$ ascertains that the output signal leads the input signal CLK, that is to say has a positive phase difference, it generates the control signal UP with a high level and the control signal DOWN with a low level. These two control signals are fed to the control unit CTR. Consequently, the control unit CTR recognizes that the delay time of the delay unit T must be increased and effects a corresponding adaptation via the control lines 1, 2. If the phase detector $\Delta\phi$ ascertains that the phase of the output clock signal lags behind that of the input clock signal CLK, that is to say ascertains a negative phase difference, it outputs the control signal UP with a low level and the control signal DOWN with a high level at its output. The control unit CTR thereupon decreases the delay time of the delay unit T via the control lines 1, 2.

Figure 3:
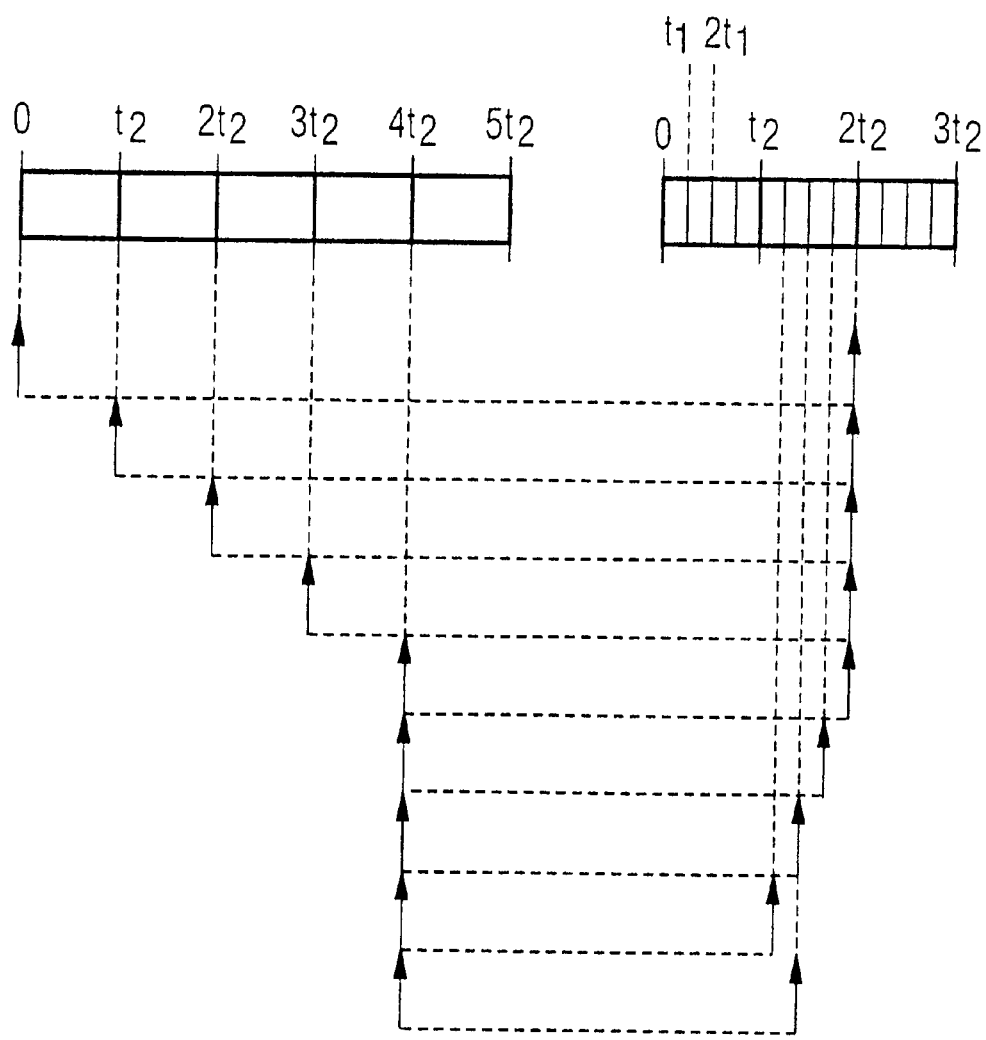
FIG. 3 is a timing diagram showing the adjustment of the delay time of the delay unit of FIG. 1.

With reference to FIG. 3, the following text provides an explanation of the way in which the delay time of the delay unit T is adjusted, during initialization of the integrated circuit, in such a way that the phase of the output clock signal at the output OUT corresponds to the phase of the input clock signal CLK at the input IN. At the beginning of the adjustment operation, the two multiplexers MUX1, MUX2 in FIG. 1 are driven by the control unit CTR via the control lines 1, 2 in such a way that none of the second delay elements I2 and eight (8) of the first delay elements I1 are arranged in the signal path between the input IN and the output OUT. FIG. 3 shows, in the left-hand part, for each adjustment step, the sum of the second delay times $t_2$ of the second delay elements I2 situated in the signal path, and, in the right-hand part, the sum of the first delay times $t_1$ of the first delay elements I1 situated in the signal path. The arrows illustrated line by line in FIG. 3 each symbolize the sum of the delay time of the first and second delay elements I1, I2 respectively situated in the signal path which is proportional to the number of first and second delay elements, respectively, situated in the signal path.

The adjustment operation is effected first of all by keeping the number of first delay elements I1 constant and by incrementally altering the number of second delay elements I2 in the signal path. The control unit CTR receives from the phase detector $\Delta\phi$ the information that the phase of the output clock signal leads that of the input clock signal CLK. It therefore increases the number of second delay elements I2 in the signal path from zero to one via the second control line 2. The second multiplexer MUX2 then connects the output of the first inverter I2 within the series circuit of the second delay elements to its output OUT. The overall delay time of the delay unit T then amounts to $3t_2$. As long as the output clock signal still has a positive phase difference with respect to the input clock signal CLK, the control unit CTR increases the number of second delay elements I2 in the signal path until it amounts to four. The overall delay time of the delay unit T is then composed of the delay time $4t_2$ of these four second delay elements I2 and the delay time $2t_2=8t_1$ of the eight first delay elements I1. The phase detector $\Delta\phi$ then detects a negative phase difference, with the result that the control unit CTR keeps the number of second delay elements I2 constant at four from that point on. At the same time, for the purpose of fine adjustment of the phase of the output clock signal, it reduces the number of first delay elements I1 in the signal path. This is again done incrementally until the phase detector $\Delta\phi$ again establishes a sign change in the phase difference. Further fine regulation is effected exclusively by way of an alteration of the number of first delay elements I1 in the signal path.

Since, in this exemplary embodiment; the number of second delay elements I2 at the beginning of the adjustment of the delay of the delay unit T is zero, the delay by the second delay elements I2 situated in the signal path can be increased up to the total delay time of all the second delay elements I2 before their number in the signal path is kept constant. As already mentioned, In practice the delay unit T will have a larger number of first and second delay elements I1, I2. In this exemplary embodiment, the number of first delay elements I1 is chosen such that the sum of their delay times $t_1$ is essentially equal to three times the second delay time $t_2$.

It is expedient for the first delay time $t_1$ to be very much smaller than the second delay time $t_2$. In that case, after coarse preadjustment, which can however be carried out rapidly, by altering the number of second delay elements I2 in the signal path, in further steps it is possible to achieve very accurate adjustment of the actual value of the delay time of the delay unit T.

At the instant at which the control unit CTR in accordance with FIG. 3 increases the number of second delay elements I2 in the signal path to four, the phase detector $\Delta\phi$ establishes a sign change in the phase difference, as already mentioned. It is then possible that the delay time of the delay unit T has become only very slightly too large, for example only by the first delay time $t_1$ or else has become very much too large, for example by almost the second delay time $t_2$. The last-mentioned case is shown in FIG. 3. It becomes clear that the sum of the first delay times $t_1$ of all the delay elements I1 of the delay unit T must be at least equal to the second delay time $t_2$ in order also to be able to compensate for these large phase deviations after the number of second delay elements I2 in the signal path has been kept constant.

The second delay time $t_2$ is chosen such that it corresponds to the maximum fluctuation range of the delay time of the delay unit T that results on account of temperature influences. Therefore, it is expedient if, as shown in FIG. 3, the sum of the first delay times $t_1$ of all the first delay elements I1 corresponds to three times the second delay time $t_2$. Specifically, it is then possible that temperature influences which become apparent only after the number of second delay elements I2 has been kept constant can be compensated for both in the positive and in the negative direction, just by altering the number of first delay elements I1, since, in the present case, eight of the first delay elements I2 are situated in the signal path at the beginning of the adjustment of the delay time and a total of twelve first delay elements are present.

I claim:

1. An integrated circuit, comprising:
    a delay unit having an input for receiving an input signal, an output for outputting an output signal delayed with respect to the input signal, and a signal path between said input and said output;
    said delay unit having first delay elements each having a first delay time and second delay elements each having a second delay time greater than the first delay time;
    a control unit connected to said delay unit for adjusting a delay of said delay unit, said control unit adjusting the delay of said delay unit by establishing a number of said first and said second delay elements in series in the signal path between said input and said output of said delay unit;
    said control unit, first, incrementally increasing or reducing a number of said second delay elements in the signal path, and thereby altering an actual value of the delay in a direction towards a setpoint value of the delay until the setpoint value is exceeded;
    said control unit, subsequently, incrementally reducing or increasing, respectively, a number of said first delay elements in the signal path, and thereby altering the actual value of the delay in a direction towards the setpoint value until the setpoint value once more crossed;
    said control unit, in response to subsequent changes in one of the setpoint value and the actual value of the delay, incrementally altering the number of said first delay elements in the signal path, while keeping the number of said second delay elements in the signal path constant; and
    wherein a sum of the first delay times of all of said first delay elements is at least three times greater than the second delay time.

2. The integrated circuit according to claim 1, wherein, at a start of a delay adjustment, the number of said first delay elements in the signal path is chosen such that the sum of the first delay times thereof is at least equal to the second delay time and is at most equal to the sum of the first delay times of all said first delay elements minus the second delay time.

3. The integrated circuit according to claim 1, wherein, at a start of a delay adjustment, none of said second delay elements are connected in the signal path.

4. The integrated circuit according to claim 1, wherein, at a start of a delay adjustment, all of said second delay elements are connected in the signal path.

* * * * *